United States Patent [19]

Nakayama

[11] Patent Number: 5,895,964
[45] Date of Patent: Apr. 20, 1999

[54] THERMOELECTRIC COOLING SYSTEM

[75] Inventor: Kazuaki Nakayama, Tokyo, Japan

[73] Assignee: Pioneer Electronic Corporation, Tokyo, Japan

[21] Appl. No.: 08/946,008

[22] Filed: Oct. 7, 1997

Related U.S. Application Data

[63] Continuation of application No. 08/591,914, Jan. 25, 1996, abandoned, which is a continuation of application No. 08/266,521, Jun. 28, 1994, abandoned.

[30] Foreign Application Priority Data

Jun. 30, 1993 [JP] Japan .................. 5-161371

[51] Int. Cl.$^6$ .................. H01L 27/082; H01L 27/102; H01L 29/70; H01L 31/11
[52] U.S. Cl. .................. 257/577; 257/587; 257/930
[58] Field of Search .................. 257/930, 577, 257/587

[56] References Cited

U.S. PATENT DOCUMENTS

| | | |
|---|---|---|
| 3,956,017 | 5/1976 | Shigemasa .................. 257/930 |
| 3,988,171 | 10/1976 | Miller et al. .................. 257/930 |
| 4,253,515 | 3/1981 | Swiatosz .................. 257/930 |
| 4,855,810 | 8/1989 | Gelb et al. .................. 257/930 |
| 5,032,897 | 7/1991 | Mansurin et al. .................. 257/930 |
| 5,168,339 | 12/1992 | Yokotani et al. .................. 257/930 |
| 5,188,286 | 2/1993 | Penu, IV .................. 257/930 |

FOREIGN PATENT DOCUMENTS

| | | |
|---|---|---|
| 63-6864 | 6/1986 | Japan . |
| 1-143347 | 6/1989 | Japan .................. 257/930 |
| 1-152654 | 6/1989 | Japan .................. 257/930 |
| 1-152655 | 6/1989 | Japan .................. 257/930 |
| 1-245549 | 9/1989 | Japan .................. 257/930 |
| 1-295449 | 11/1989 | Japan .................. 257/930 |
| 2-278815 | 11/1990 | Japan .................. 257/930 |
| 4-216655 | 8/1992 | Japan .................. 257/930 |
| 5-47996 | 2/1993 | Japan .................. 257/930 |

Primary Examiner—Ngân V. Ngô

[57] ABSTRACT

A circuit element is produced in a circuit, and a thermoelectric cooling element comprising two dissimilar metals is thermally coupled to the circuit element for cooling the circuit element. A source is provided for applying a driving current to the circuit element. The circuit is arranged such that the driving current passes to the thermoelectric cooling element as an operating current thereof.

6 Claims, 5 Drawing Sheets

FIG.3a
FIG.3b
PRIOR ART
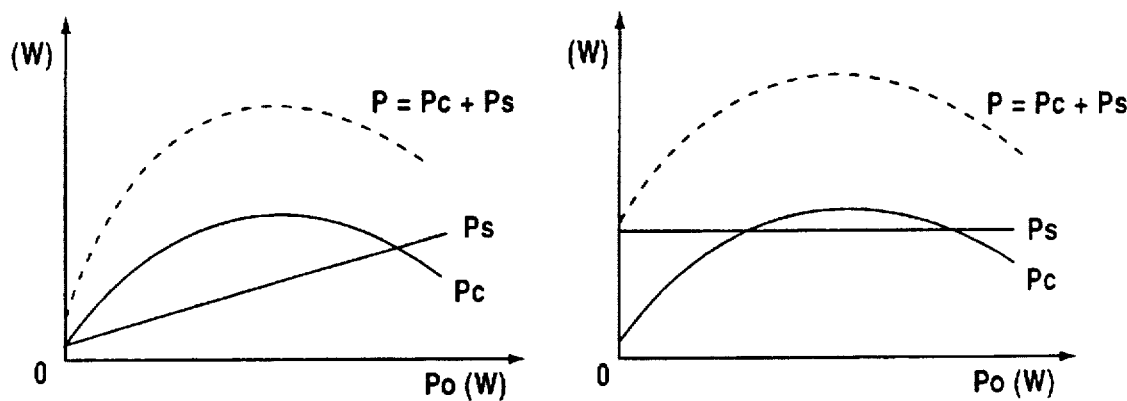
Po: OUTPUT POWER
Pc: COLLECTOR DISSIPATION
Ps: COOLING POWER
Pc + Ps = P: POWER CONSUMPTION
FIG.4
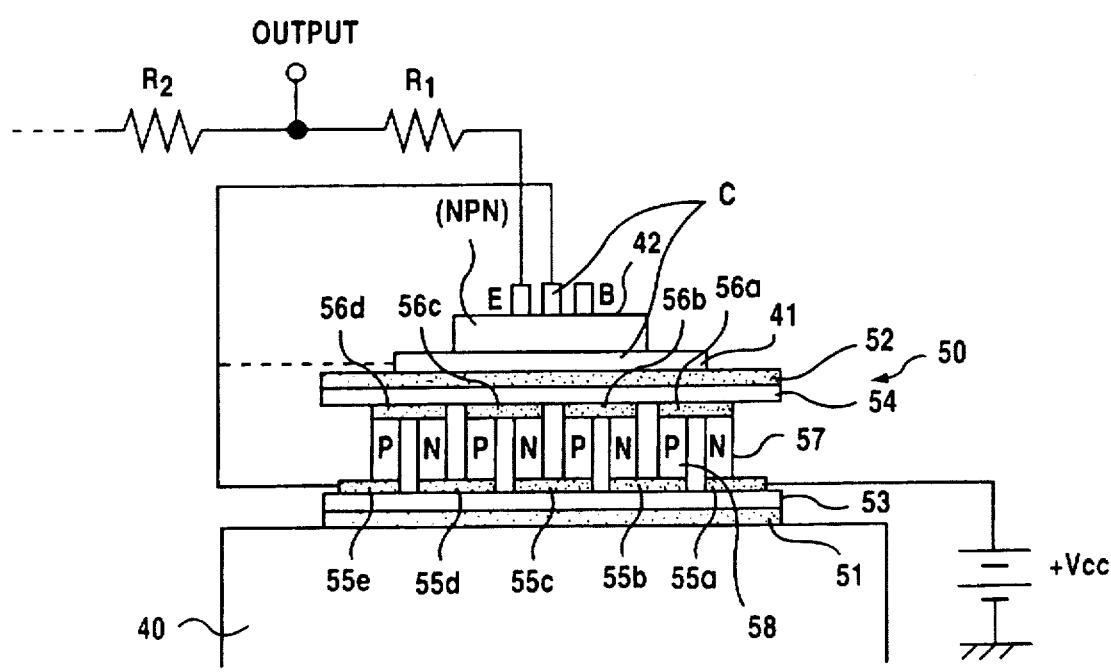

1

THERMOELECTRIC COOLING SYSTEM

This application is a continuation of application Ser. No. 08/591,914 filed Jan. 25, 1996 now abandoned which is a continuation of 08/266,521 filed Jun. 28, 1994, now abandoned.

BACKGROUND OF THE INVENTION

The present invention relates to a thermoelectric cooling system based on the Peltier effect, for reducing heat of a transistor provided in a circuit.

The principle of the Peltier effect is a phenomenon that if a direct current is passing through two dissimilar metals such as conductor and semiconductor which are in contact with each other, absorption or radiation of heat other than the Joule heat occurs at a junction. For example, if the direct current flows from a metal to a P-type semiconductor, heat is absorbed at a junction. If the current flows in the reverse direction, heat is radiated at the junction. If the direct current flows from a metal to an N-type semiconductor, heat is radiated at a junction. If the current flows in the reverse direction, the heat is absorbed at the junction.

The thermoelectric cooling device has various superior characteristics. For example, since no movable portion is provided, noises do not occur. Furthermore, in the device using the thermoelectric cooling device, temperature is easily adjusted, the device can be used as a cooling device or a heating device only by changing the direction of flow of the current, and the size of the device is reduced. Thus, the cooling device has been practically used for a small refrigerator, isothermal bath, dew point thermometer, electronic device, and others.

Japanese Patent Application Laid-open 63-6864 discloses a thermoelectric cooling system where a transistor is provided with a P-type semiconductor disposed between metal plates. A current for cooling the transistor is applied from a dependent supply source to the transistor through an input/output lead and fed to a heat sink through the P-type semiconductor. The cooling current is set to a constant value. The heat is absorbed at a junction of one of the metals adjacent to the transistor and the P-type semiconductor. The heat is radiated at a junction of the other metal adjacent to the heat sink and the P-type semiconductor. The heat is discharged from the heat sink to the atmosphere.

In the cooling system, if a driving current of the transistor changes in accordance with driving conditions of the transistor, the amount of heat of the transistor changes. Since the current is constant regardless of the change of the driving current, cooling dependent on the change of the driving current is not effected. Therefore, if the transistor is driven at a low load, the power for cooling current is wasted. Furthermore, the transistor may be over-cooled. In such a case, an operating point of the transistor may be deflected to distort a signal waveform.

SUMMARY OF THE INVENTION

An object of the present invention is to provide a thermoelectric cooling system in which a cooling element is operated in accordance with the amount of heat of a transistor, so that the transistor is properly operated, with a good cooling efficiency.

According to the present invention, there is provided a thermoelectric cooling system comprising a circuit element, a thermoelectric cooling element including two dissimilar conductors including semiconductors and thermally coupled to the circuit element to be cooled, a circuit including the thermoelectric cooling element, the circuit element, and a source for applying a driving current to the circuit element, the circuit being arranged such that at least a part of the driving current passes to the thermoelectric cooling element as an operating current thereof.

In an embodiment of the present invention, the circuit element is a transistor.

The other objects and feature of this invention will become understood from the following description with reference to the accompanying drawings.

BRIEF DESCRIPTION OF DRAWINGS

FIGS. 3a and 3b are diagrams showing operational characteristics of the system of the present invention and a conventional cooling system;

FIG. 4 is a schematic diagram showing a second embodiment of the present invention;

DETAILED DESCRIPTION OF THE PREFERRED EMBODIMENTS

Figure 1:
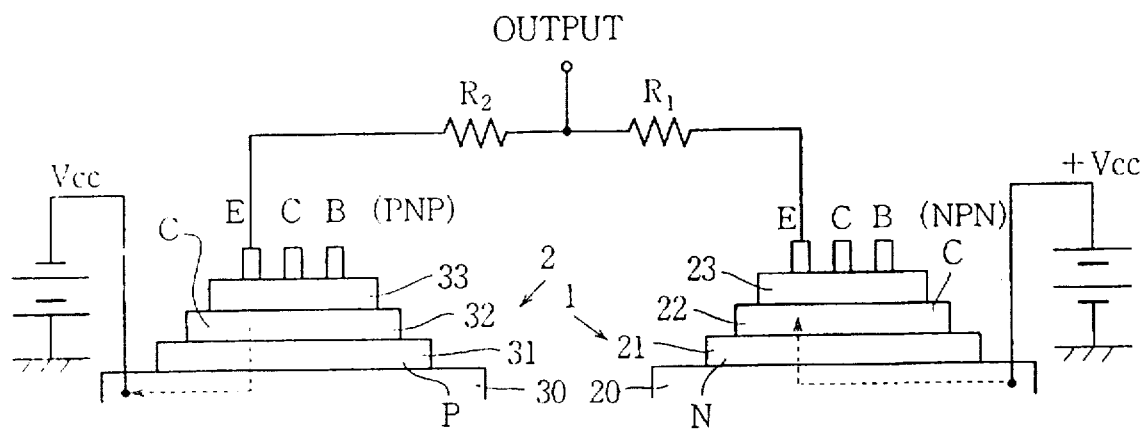
FIG. 1 is a schematic diagram showing a thermoelectric cooling system for a transist according to the present invention.
Figure 2:
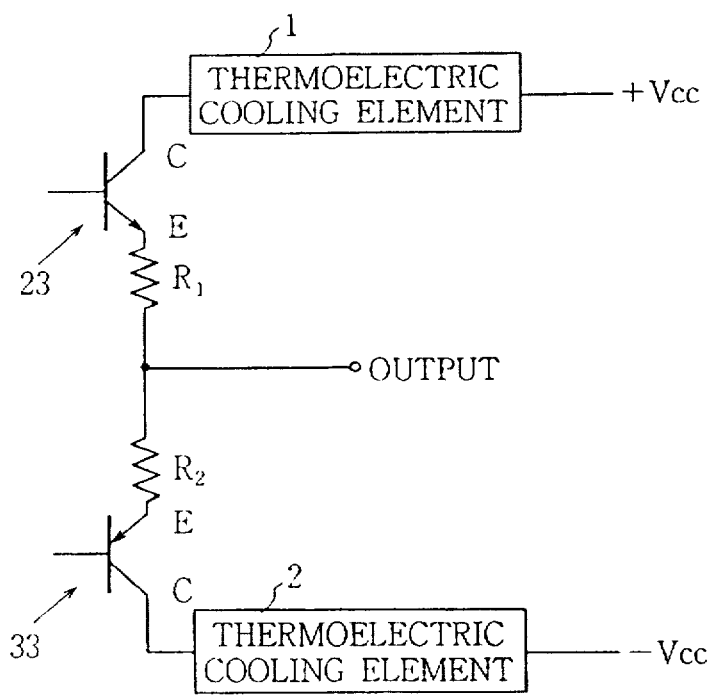
FIG. 2 shows an equivalent circuit of the system of FIG. 1.

Referring to FIGS. 1 and 2 showing an embodiment of a thermoelectric cooling system according to the present invention, a single ended push-pull circuit of an emitter follower type comprises an NPN transistor 23 connected to a first thermoelectric cooling element 1 and a PNP transistor 33 connected a second thermoelectric cooling element 2.

The first thermoelectric cooling element 1 comprised an N-type semiconductor 21 mounted on a heat sink 20, and a metal plate 22 made of copper and mounted on the semiconductor 21. The metal plate 22 is a part of a case of the transistor 23 and used as a collector C of the transistor. The N-type semiconductor 21 is a solid solution made of $Bi_2Te_3$ including $Bi_2Se_3$ of between 5 and 25%.

The NPN transistor 23 is mounted on the metal plate 22. A collector supply voltage +Vcc is applied to the collector C (metal plate 22) of the transistor 23 through the heat sink 20 and semiconductor 21.

The second thermoelectric cooling element 2 comprises a P-type semiconductor 31 mounted on a heat sink 30, and a metal plate 32 made of copper and mounted on the semiconductor 31. The metal plate 32 is similar to the metal plate 22. The P-type semiconductor 31 is a solid solution made of $Bi_2Te_3$ including $Sb_2Te_3$ of between 5 and 25%.

The PNP transistor 33 is mounted on the metal plate 32. A collector supply voltage −Vcc is applied to the collector C (metal plate 32) of the transistor 33 through the heat sink 30 and semiconductor 31.

An emitter E of the NPN transistor 23 is connected to an emitter E of the PNP transistor 33 through resistors R1 and R2. Emitters E are lead to an output.

Describing the operation of the cooling system, when the NPN transistor 23 is driven, the collector supply voltage +Vcc is applied to the collector C of the transistor 23 through the heat sink 20 and semiconductor 21. Since a driving current flows through the N-type semiconductor 21, the cooling operation is controlled in dependency on a collector current of the transistor 23. At the junction of the heat sink 20 and the semiconductor 21, the heat is radiated. The heat is discharged to the atmosphere through the heat sink 20. At the junction of the semiconductor 21 and the metal plate 22, the heat is absorbed.

On the other hand, when the PNP transistor 33 is driven, a driving current passes to the source of the collector supply voltage −Vcc through the P-type semiconductor 31 and heat sink 30 from the collector C. At the junction of the metal plate 32 and the semiconductor 31, the heat is absorbed. At the junction of the semiconductor 31 and the heat sink 30, the heat is radiated. Thus, the heat is discharged from the heat sink 30.

FIG. 3a is an operating characteristic in a class B push-pull operation of the present invention and FIG. 3b shows an operating characteristic of the conventional system.

It will be seen that, in the present invention, a cooling power Ps is increased with an increase of an output power Po. On the other hand, in the conventional system, the cooling power Ps is constant irrespective of the increase of the output power Po.

Furthermore, it will be seen from the entire power consumption P (P=Pc+Ps) that the waste of the power is reduced at a lower power supply. Since over-cooling to the transistors 23 and 33 is prevented, variations of parameters such as $V_{BE}$, $h_{fe}$, $h_{ie}$, and $f_T$ are prevented, thereby eliminating the deflection of the operating point and distortion of the signal waveform.

Referring to FIG. 4 showing a second embodiment, an NPN transistor 42 is mounted on a thermoelectric cooling module 50 mounted on a heat sink 40. The cooling module 50 comprises a lower frame 51 made of copper and secured to the heat sink 40 and an upper frame 52 made of copper on which the NPN transistor 42 is mounted. Insulator plates 53 and 54 are secured to inside portions of the lower and upper copper plates 51 and 52, respectively. The insulator plate is made of alumina ceramic having a good heat conductivity. A plurality of metal plates 55a, 55b, 55c, 55d and 55e are secured to the inside portion of the insulator plate 53. A plurality of metal plates 56a, 56b, 56c and 56d are secured to the inside portion of the insulator plate 54. A plurality of N-type semiconductors 57 and P-type semiconductors 58 are alternately disposed between the metal plates 55a to 55e, and 56a to 56d.

The source of the collector supply voltage +Vcc is connected to the metal plate 55a. A collector C of the transistor 42 is connected to the metal plate 55e.

Since a PNP transistor has the same construction as the transistor 42, the description thereof is omitted.

Describing the operation, the collector supply voltage +Vcc is applied to the transistor 42 through the cooling module 50. Namely, the current passes to the metal plate 55a, N-type semiconductor 57, metal plate 56a, P-type semiconductor 58, metal plate 55b, N-type semiconductor 57, metal plate 56b, P-type semiconductor 58, metal plate 55c, N-type semiconductor 57, metal plate 56c, P-type semiconductor 58, metal plate 55d, N-type semiconductor 57, metal plate 56d, P-type semiconductor 58, and metal plate 55e in order.

Thus, at junctions of metal plates 56a to 56d and N-type and P-type semiconductors 57 and 58, the heat is absorbed. At junctions of metal plates 55a to 55e and N-type and P-type semiconductors 57 and 58, the heat is radiated. The heat is discharged through the heat sink 40.

The collector supply voltage +Vcc through the cooling module 50 may be applied to a metal plate 41 as a collector.

In the embodiment, the module 50 is electrically connected to the transistors in series and thermally connected to the transistors in parallel through the N-type and P-type semiconductors 57 and 58. Thus, the current can be reduced.

Figure 5:
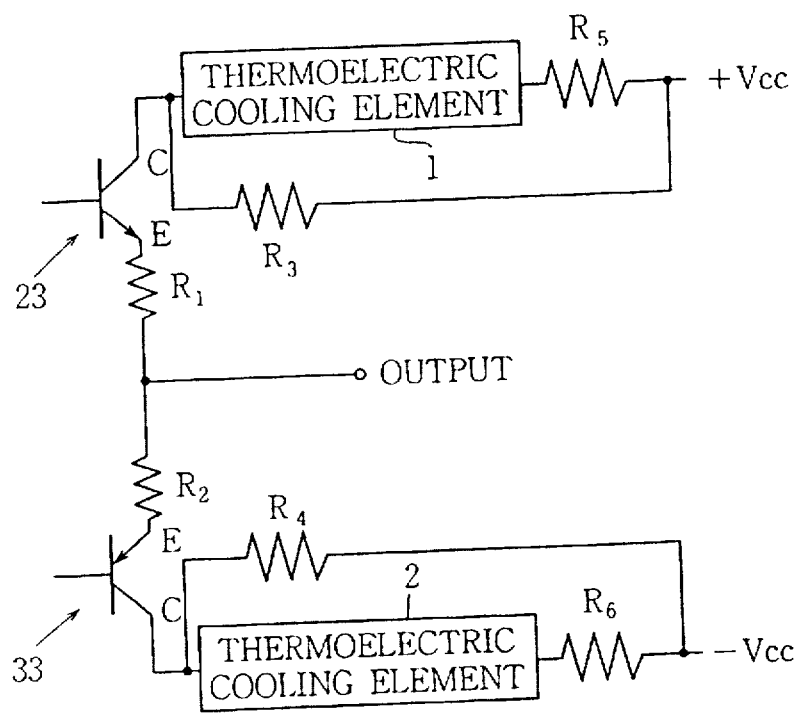
FIG. 5 shows a modification of the circuit of FIG. 2.

FIG. 5 shows a modification of the circuit of FIG. 2. Series resistors R5 and R6, and parallel resistors R3 and R4 are connected to the cooling elements 1 and 2, respectively, for adjusting the current passing to the elements.

Figure 6:
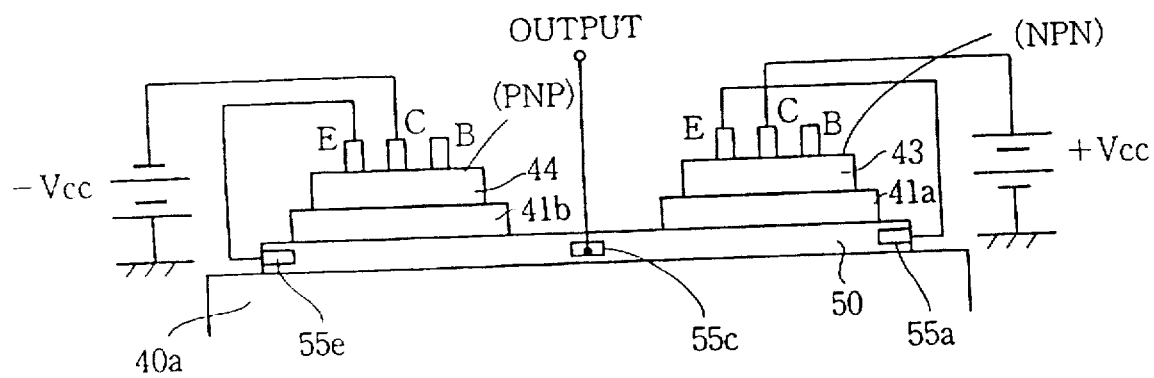
FIG. 6 is a schematic diagram showing a third embodiment of the present invention.
Figure 7:
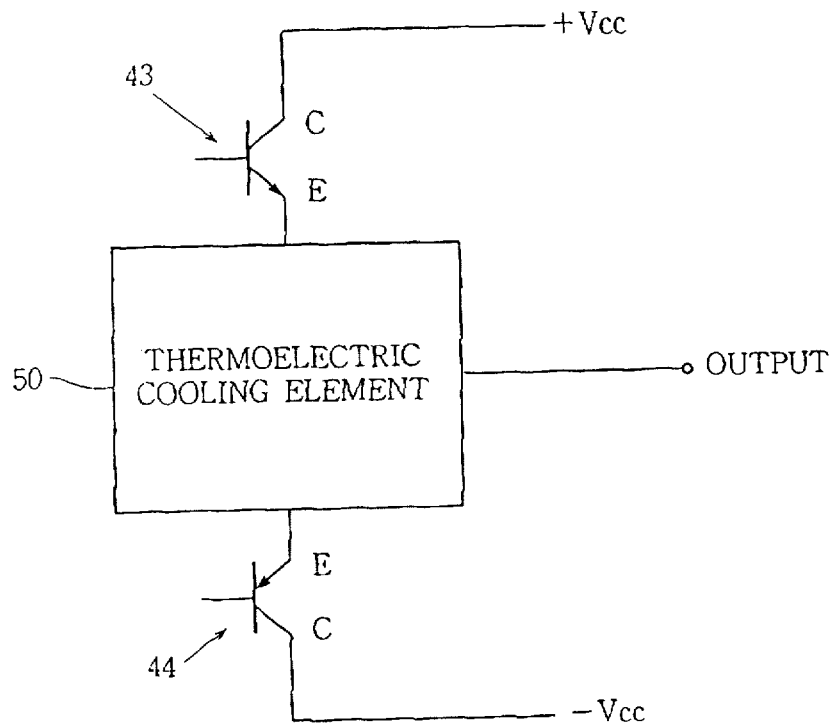
FIG. 7 shows an equivalent circuit of the third embodiment.

FIGS. 6 and 7 show a third embodiment. The cooling module 50 is commonly used for an NPN transistor 43 and a PNP transistor 44. The cooling module 50 is mounted on a heat sink 40a. A metal plate 41a is secured to the module 50 and the transistor 43 is mounted on the metal plate 41a. A metal plate 41b is secured to the module 50 and the transistor 44 is mounted on the metal plate 41b. The collector supply voltage +Vcc is applied to a collector C of the NPN transistor 43, and an emitter E of the transistor 43 is connected to the metal plate 55a of the module. The collector supply voltage −Vcc is applied to a collector C of the PNP transistor 44, and an emitter E thereof is connected to the metal plate 55e. The output is lead from the plate 55c.

The cooling operation is controlled in dependency on the respective emitter currents.

In the embodiment, internal resistances between metal plates 55a and 55c and between metal plates 55c and 55e serve as emitter resistors R1 and R2 so that resistors R1 and R2 can be omitted. Thus, power consumption just necessary for cooling the transistors in the previous embodiments can be reduced.

Figure 8:
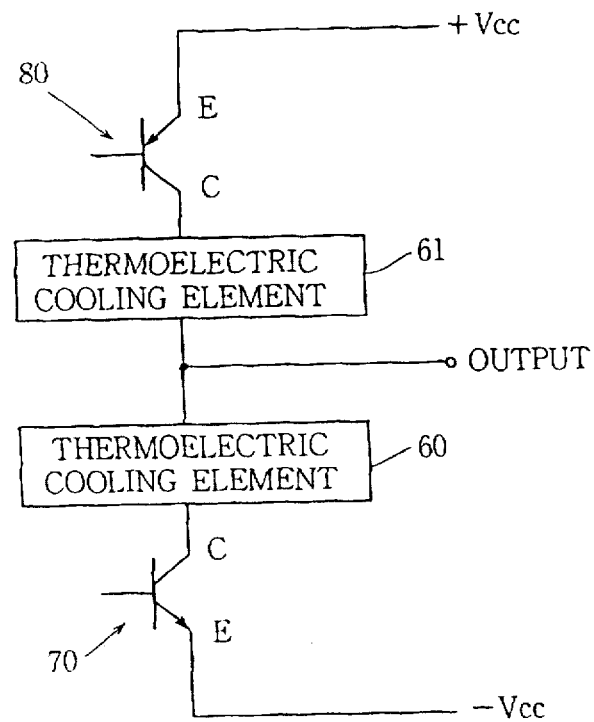
FIG. 8 shows an equivalent circuit of a fourth embodiment.
Figure 9:
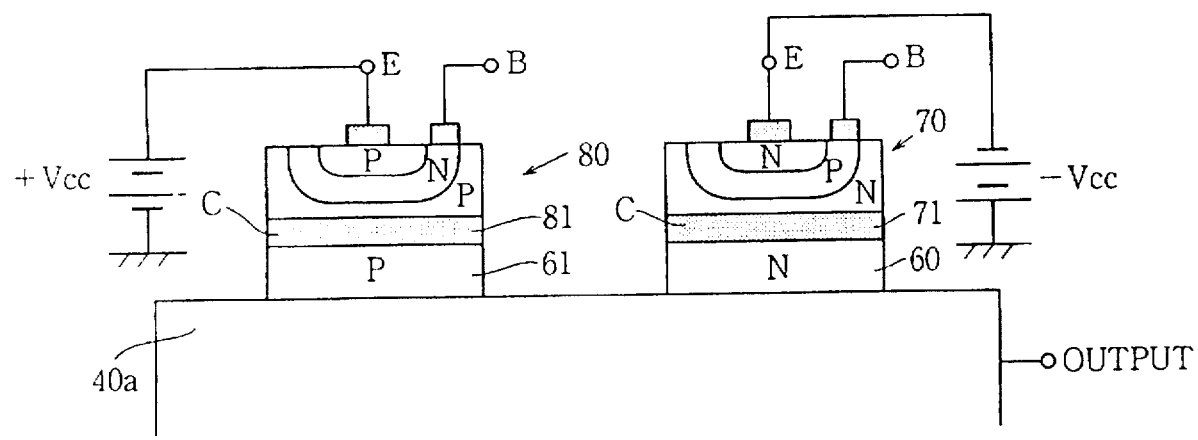
FIG. 9 is a schematic diagram showing the fourth embodiment.

Referring to FIGS. 8 and 9 showing a fourth embodiment, a cooling system comprises an N-type semiconductor 60 and a P-type semiconductor 61 secured to the heat sink 40a made of metal. An NPN transistor 70 is mounted on the N-type semiconductor 60. A collector C (metal base 71) is connected to the semiconductor 60. The collector supply voltage −Vcc is applied to an emitter E thereof. A PNP transistor 80 is mounted on the P-type semiconductor 61. A collector C (metal base 81) is connected to the semiconductor 61. The collector supply voltage +Vcc is applied to an emitter E. The heat sink 40a is lead to an output terminal. Thus, a push-pull circuit of the collector output type is formed.

The cooling operation is controlled in dependency on the collector currents.

In the embodiment, the cooling system is simplified in construction.

In accordance with the present invention, the cooling element is operated in dependency on the driving current, that is, the heat radiated from the transistor. Consequently, the transistor is prevented from over-cooling so that the transistor is properly operated with an effective cooling effect.

While the presently preferred embodiments of the present invention have been shown and described, it is to be understood that these disclosures are for the purpose of illustration and that various changes and modifications may be made without departing from the scope of the invention as set forth in the appended claims.

What is claimed is:

1. A thermoelectric cooling system comprising:

a circuit element; and a thermoelectric cooling element including a metal plate directly mounted on one surface of the circuit element, a semiconductor mounted on the metal plate, and a heat sink mounted on the semiconductor, wherein said circuit element is thermally connected to said thermoelectric cooling element, and said circuit element and said thermoelectric cooling element being arranged such that at least part of a driving current, which is applied to said circuit element, flows passing through said thermoelectric cooling element, wherein said thermoelectric cooling element is operated to cool said circuit element.

2. The system according to claim 1 wherein the circuit element is a transistor.

3. The system according to claim 2 wherein said metal plate is a collector of the transistor.

4. The system according to claim 1 further comprising a plurality of types of transistors, wherein the heat sink is made of metal, and wherein the transistors are thermally and electrically coupled on the heat sink, respectively.

5. The system according to claim 4 wherein the plurality of transistors forms an output stage of a push-pull circuit of a collector output type, and the heat sink is connected to an output terminal of the push-pull circuit.

6. A thermoelectric cooling system comprising:

a circuit element having terminals for applying a driving current to the circuit element;

a metal plate having said circuit element mounted on one surface thereof;

a semiconductor mounted on another surface of said metal plate, said semiconductor thermally coupled to said circuit element; and a heat sink mounted on said semiconductor, wherein a thermoelectric cooling element is formed by said metal plate, said semiconductor and said heat sink, and wherein at least part of said driving current applied to said circuit element passes through the thermoelectric cooling element as an operating current of the thermoelectric cooling element.

* * * * *